United States Patent [19]  [11] Patent Number: 4,890,148
Ikeda et al.  [45] Date of Patent: Dec. 26, 1989

[54] SEMICONDUCTOR MEMORY CELL DEVICE WITH THICK INSULATIVE LAYER

[75] Inventors: Shuji Ikeda, Koganei; Kouichi Nagasawa, Kunitachi; Satoshi Meguro, Tokyo; Sho Yamamoto, Kodaira, all of Japan

[73] Assignee: Hitachi, Ltd., Tokyo, Japan

[21] Appl. No.: 218,486

[22] Filed: Jul. 7, 1988

Related U.S. Application Data

[63] Continuation of Ser. No. 764,208, Aug. 8, 1985, abandoned.

[30] Foreign Application Priority Data

Aug. 31, 1984 [JP] Japan ................................. 59-180533
Oct. 19, 1984 [JP] Japan ................................. 59-218470
Oct. 19, 1984 [JP] Japan ................................. 59-218471
Oct. 19, 1984 [JP] Japan ................................. 59-218472

[51] Int. Cl.$^4$ ............................................. H01L 27/10
[52] U.S. Cl. .................................... 357/45; 357/23.5; 357/42; 357/41; 357/59; 357/67
[58] Field of Search .................... 357/23.5, 42, 41, 47, 357/675, 59 I, 59 J, 59 H, 45, 49

[56] References Cited

U.S. PATENT DOCUMENTS

| 4,125,854 | 11/1978 | McKenny et al. ..................... 357/41 |
| 4,240,097 | 12/1980 | Raymond, Jr. ................ 357/59 F X |
| 4,246,593 | 1/1981 | Bartlett ................................. 357/41 |
| 4,248,592 | 1/1981 | Bartlett ................................. 357/41 |
| 4,453,175 | 6/1984 | Ariizumi et al. ............. 357/59 F X |
| 4,471,374 | 9/1984 | Hardee et al. ......................... 357/59 |

FOREIGN PATENT DOCUMENTS

| 0086429 | 12/1982 | European Pat. Off. ........... 357/23.5 |
| 0087979 | 9/1983 | European Pat. Off. ........... 357/23.5 |
| 0088912 | 9/1983 | European Pat. Off. ........... 357/23.5 |
| 0099983 | 2/1984 | European Pat. Off. ........... 357/23.5 |
| 0146356 | 6/1985 | European Pat. Off. ........... 357/23.5 |
| 2019091 | 10/1979 | United Kingdom . |
| 2038552 | 7/1980 | United Kingdom . |
| 2070329 | 9/1981 | United Kingdom ............... 357/23.5 |

OTHER PUBLICATIONS

Lyman, "Scaling the Barriers to VLSI's Fine Lines," *Electronics*, Jun. 19, 1980, pp. 115–123.
Sequeda, "The Role of Thin Film Materials on the Technology of Integrated Circuit Fabrication," *Journal of Metals*, Nov. 85, pp. 54–59.
Murarka, "Refractory Silicides for Integrated Circuits," *J. Vac. Sci. Technol.*, 17(4), Jul./Aug. 1980, pp. 775–792.

*Primary Examiner*—William Mintel
*Attorney, Agent, or Firm*—Antonelli, Terry & Wands

[57] ABSTRACT

A static RAM exhibiting a high reliability and suited to a higher density of integration is disclosed. In each memory cell of this static RAM, the cross coupling of a flip-flop circuit is made by gate electrodes of MISFETs constituting this flip-flop circuit. In addition, a source line is formed by the same step as that of a word line. A resistance value of a polycrystalline silicon layer which is a load resistor is changed in accordance with information to be stored. Furthermore, semiconductor regions for preventing soft errors attributed to alpha particles etc. are formed under the MISFETs constituting the flip-flop circuit, so that the channels are not adversely affected.

17 Claims, 9 Drawing Sheets

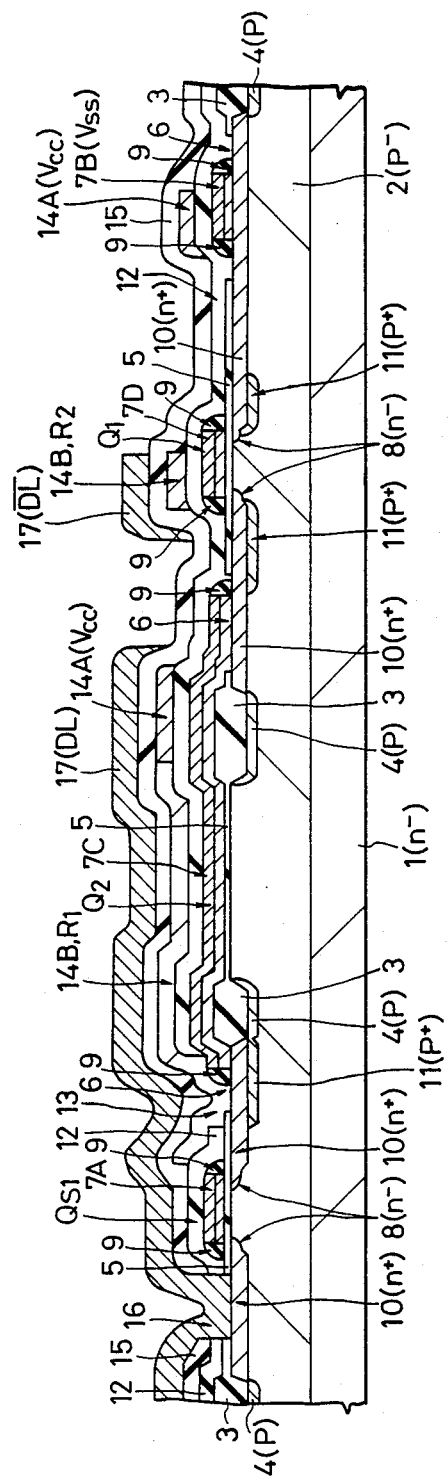

SEMICONDUCTOR MEMORY CELL DEVICE WITH THICK INSULATIVE LAYER

This application is a continuation of application Ser. No. 764,208, filed on Aug. 8, 1985, now abandoned.

BACKGROUND OF THE INVENTION

The present invention relates to a semiconductor integrated circuit device, and more particularly to a technique which is effective when applied to a semiconductor integrated circuit device comprising a static random access memory (hereinbelow, abbreviated to 'SRAM').

The memory cell of an SRAM is constructed of a flip-flop circuit wherein a pair of inverter circuits are cross-coupled. Each of the inverter circuits is arranged such that a load element and a drive MISFET (gate-insulated field effect transistor) are connected in series. The power source potential is applied to the common terminal of the two load elements thereto. The common source of the two drive MISFETs is supplied with the ground potential of circuitry.

A memory cell of the type in which a resistance element made of polycrystalline silicon is employed as a load element, has been known. The memory cell of this type is suited to high density integration because the resistance element can be formed over a drive MISFET. An SRAM having memory cells of this type has been disclosed in Japanese Patent Application Laid-open No. 54-128295 Japanese Patent Application No. 57-160999 or Japanese Patent Application No. 59-125247. It was also published as "A 30 ns 64k CMOS RAM" by Kim Hardee, Michael Griffus and Ron Galvas in IEEE International Solid-State Circuits Conference in 1984.

SUMMARY OF THE INVENTION

The inventors made studies on enhancing the densities of integration of SRAMs, and have found the following problems:

First, wiring for cross-coupling two inverter circuits needs to be formed of conductor layers different from each other. In, for example, the SRAM described in Japanese Patent Application No. 59-125247, the first crossing wiring is formed of a semiconductor region, while the second crossing wiring is formed of a conductor layer which lies above gate electrodes and which is fabricated by the same step as that of resistance elements. The second wiring is laid between the two resistance elements in order to prevent the area of a memory cell from enlarging. Therefore, the pitch between the resistance elements increases. Since this pitch between the resistance elements determines the pitch between the gate electrodes of the MISFETs of a flip-flop circuit to be arranged below the resistance elements, the area of the memory cell increases eventually.

Secondly, the ground potential of circuitry is supplied to the common source of the two drive MISFETs by a wiring line which is made of a semiconductor region. Since the resistance value of this wiring line is as high as several tens [$\Omega/\square$] or so, the potential thereof is liable to rise. Consequently, the difference between a power source potential and the source potential becomes small. That is, margins in the operations of writing and reading information narrow, and malfunctions are prone to occur. For suppressing the malfunctions, the cross-sectional area of the wiring line needs to be increased so as to lower the resistance thereof. It is accordingly difficult to reduce the area of the memory cell.

Thirdly, in order to microminiaturize the memory cell while preventing soft errors attributed to alpha particles etc., Japanese Patent Application No. 57-160999 discloses the technique wherein a P-type semiconductor region of comparatively high impurity concentration is provided under the source region or drain region of the drive MISFET. For the purpose of suppressing fluctuation in the threshold voltage of the drive MOSFET and increase in the substrate effect, it is necessary to prevent the P-type semiconductor region from being formed in a channel region. To this end, a mask for introducing a P-type impurity needs to be provided. As a result, an allowance for mask registration is required, and it hampers the enhancement of the density of integration. Moreover, the threshold voltage fluctuates due to mask misregistration.

Fourthly, the resistance value of the resistance element is set very large in order to lower the power dissipation. The current supply ability is therefore low, so that the speed of writing information into the memory cell is low.

An object of the present invention is to provide a technique which enhances the density of integration of a semiconductor integrated circuit device.

Another object of the present invention is to provide a technique which enhances the reliability of a semiconductor integrated circuit device.

Another object of the present invention is to provide, in an SRAM, a technique which stably holds information written in a memory cell and enhances the reliability thereof.

Another object of the present invention is to provide, in an SRAM, a technique which reduces the resistance value of a wiring line for a fixed voltage.

Another object of the present invention is to provide, in an SRAM, a technique which prevents soft errors and which also prevents fluctuation in the threshold voltage of a MISFET as well as increase in the substrate effect.

Still another object of the present invention is to provide, in an SRAM, a technique which raises the speed of writing information into a memory cell.

The aforementioned and other objects and novel features of the present invention will become apparent from the description of this specification and the accompanying drawings.

Typical aspects of performance of the present invention will be summarized below.

The gate electrode of one of two drive MISFETs is extended, and is used for cross-coupling. Thus, it is dispensed with to lay wiring for cross-coupling between gate electrodes. It is also dispensed with to lay wiring for cross-coupling between resistance elements which lie above the gate electrodes.

A wiring line for the common source of the two drive MISFETs is made of a conductor layer the resistance value of which is lower than that of a semiconductor region. Thus, the density of integration of an SRAM can be enhanced.

A semiconductor region for preventing soft errors is formed in such a way that the gate electrodes of the two drive MISFETs and films on the side walls thereof are used as a mask. Thus, the semiconductor region is not formed in the channel region of the drive MISFET.

The two resistance elements are placed over the gate electrodes of the two drive MISFETs. This makes it possible to change the resistance values of the resistance elements in correspondence with information (voltages) which is (are) to be written into the memory cell, and to feed currents in the directions in which the voltage difference of "1" and "0" is clarified (self-bias).

BRIEF DESCRIPTION OF THE DRAWINGS

FIG. 3 is a sectional view taken along line III—III in FIG. 2A; and

FIGS. 4 to 10 are views showing the memory cell of an SRAM at various manufacturing steps for explaining a manufacturing process of one embodiment of the present invention, in which:

FIGS. 4 to 6 are plan views thereof, and

FIGS. 7 to 10 are sectional views thereof.

DESCRIPTION OF THE PREFERRED EMBODIMENT

The present invention will now be described in connection with an embodiment applied to an SRAM wherein the flip-flop circuit of a memory cell is constructed of two resistance elements and two MISFETs.

Figure 1:
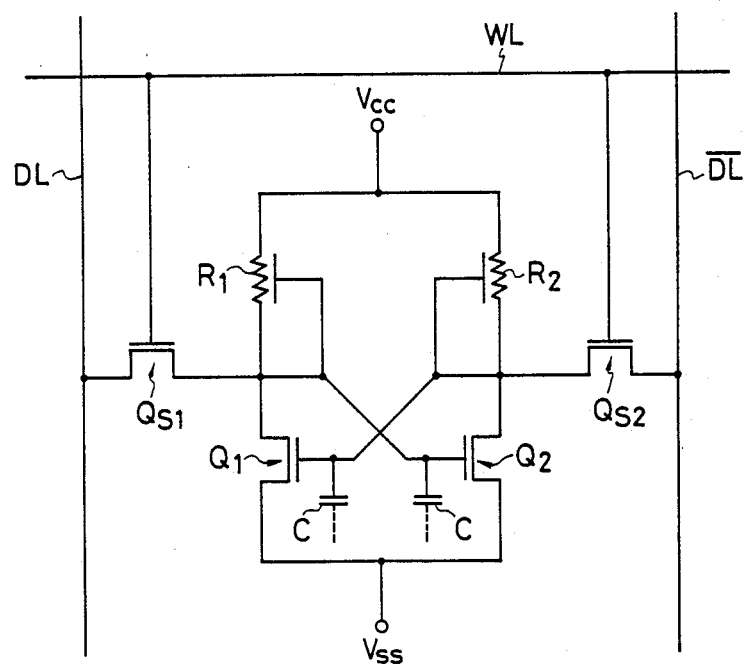
FIG. 1 is an equivalent circuit diagram showing the memory cell of an SRAM for explaining one embodiment of the present invention.

FIG. 1 is an equivalent circuit diagram showing the memory cell of an SRAM for explaining one embodiment of the present invention.

Components having the same functions are assigned the same symbols in all the drawings of the embodiment, and shall not be repeatedly described.

Referring to FIG. 1, symbol WL denotes a word line which extends in a row direction, and a plurality of word lines are laid in a column direction (hereinbelow, the direction in which the word lines extend shall be called the row direction).

Symbols DL and $\overline{DL}$ denote a set of complementary data lines which extend in the column direction, and a plurality of sets are laid in the row direction (hereinbelow, the direction in which the data lines extend shall be called the column direction).

The memory cell of the SRAM comprises a flip-flop circuit which has a pair of input/output terminals, and switching MISFETs $Q_{s1}$ and $Q_{s2}$ which are respectively connected to the input/output terminals. A plurality of such memory cells are arranged and disposed at the predetermined intersection between the word lines WL and the data lines DL, $\overline{DL}$, and constitute a memory cell array.

One of the source and drain regions of each switching MISFET is connected to the data line DL or $\overline{DL}$, while the other is connected to the input/output terminal of the flip-flop. The word line WL is connected to the gate electrodes of both the switching MISFETs $Q_{s1}$ and $Q_{s2}$. The MISFETs $Q_{s1}$ and $Q_{s2}$ are switches which are controlled by the word line WL, and they serve to selectively connect the flip-flop circuit with the data lines DL and $\overline{DL}$.

The flip-flop circuit comprises MISFETs $Q_1$ and $Q_2$ and resistance elements $R_1$ and $R_2$. This flip-flop circuit stores information "1" or "0" which is transmitted from the data line DL or $\overline{DL}$. The flip flop circuit comprises two inverter circuits which are cross-coupled. The respective inverter circuits comprise the resistance element $R_1$ as a load the drive MISFET $Q_1$, and those $R_2$ and $Q_2$. The output of one of the inverter circuits is applied to the gate electrode of the drive MISFET as the input of the other inverter circuit in mutual fashion. The cross-coupling therefor is realized without lowering the density of integration as will be described later, in accordance with the present invention.

The inverter circuits are supplied with a power source potential $V_{cc}$ through the corresponding resistance elements $R_1$ and $R_2$. The resistance elements $R_1$ and $R_2$ control the magnitudes of currents to flow from the power source $V_{cc}$, and stably hold the written information. According to the present invention, the resistance elements $R_1$ and $R_2$ are self-biased as will be described later. That is, the resistance values of the resistance elements $R_1$ and $R_2$ are changed in correspondence with signals to be delivered as outputs by the inverter circuits.

The two inverter circuits are connected to a fixed potential, for example, the ground potential $V_{ss}$ of circuitry by common wiring. To this end, the sources of the two drive MISFETs are connected to the common wiring for the ground potential. According to the present invention, this wiring is not formed of a semiconductor region but is formed of a layer having a still lower resistance.

In the memory cell, the written information can be regarded as being stored in a parasitic capacitance C. The parasitic capacitance C includes principally the capacitance of the gate electrode of the MISFET $Q_1$ or $Q_2$ and the junction capacitance between one semiconductor region (source region or drain region) and a substrate. According to the present invention, the parasitic capacitances C are increased and soft errors are reduced without exerting influences on the MISFETs $Q_1$ and $Q_2$.

Figure 2A:
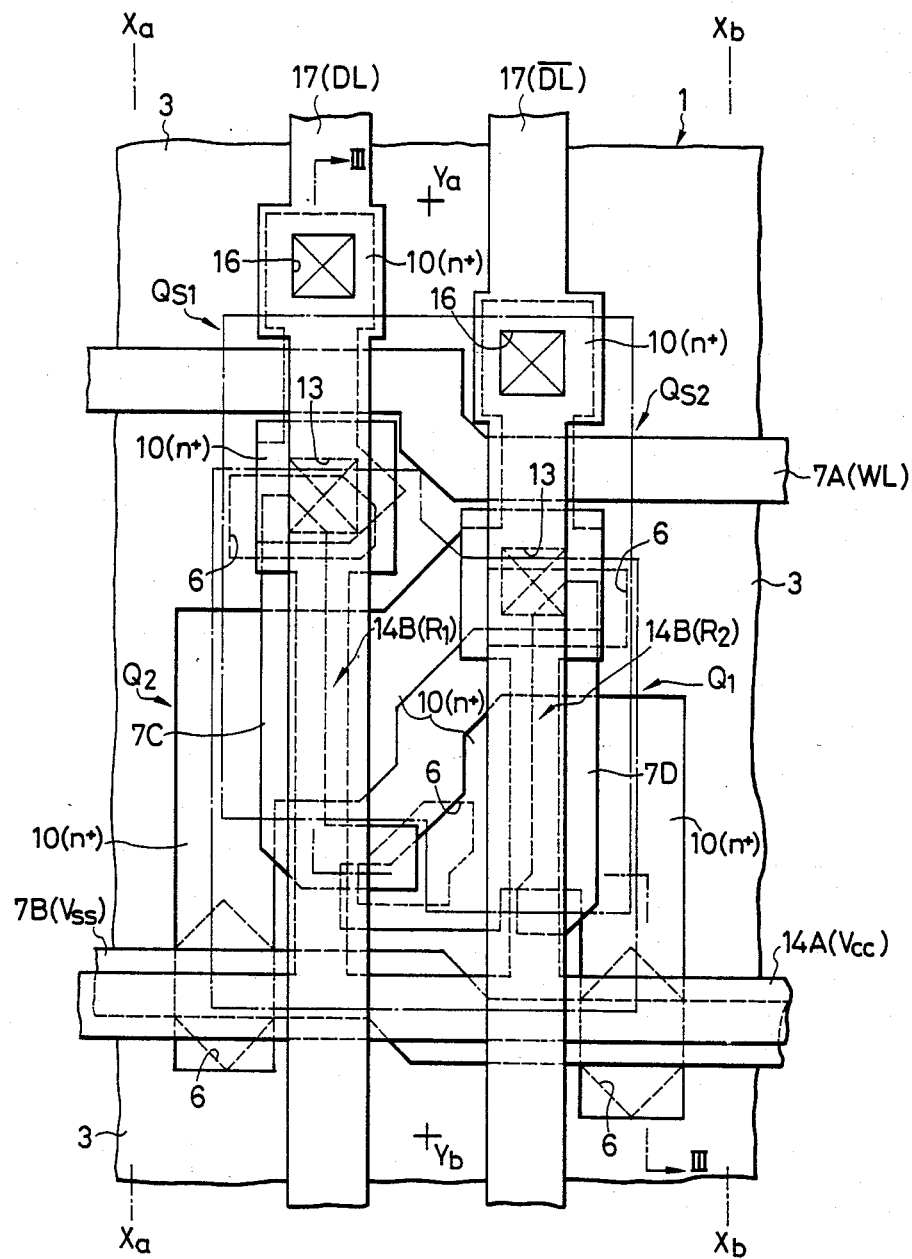
FIG. 2A is a plan view showing the memory cell of an SRAM for explaining one embodiment of the present invention.
Figure 2B:
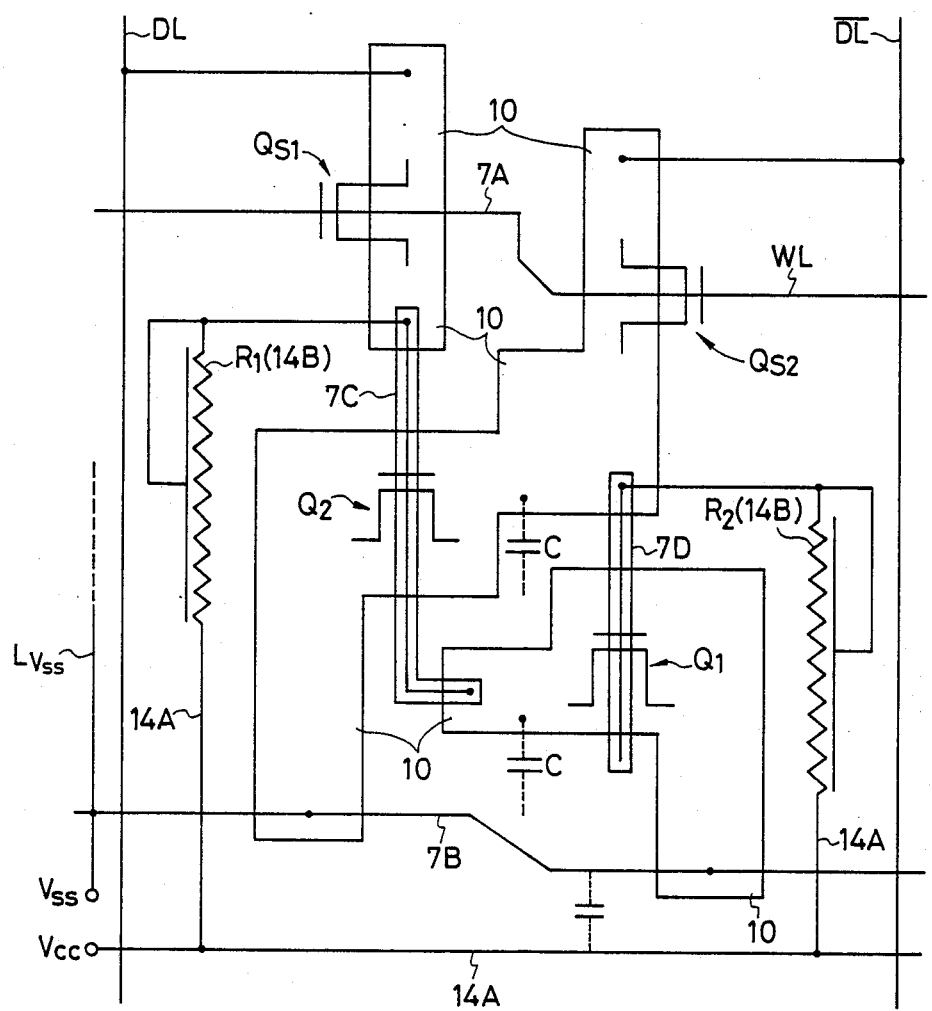
FIG. 2B is a view with FIG. 2A simplified, schematically showing the features of the present invention.

FIG. 2A is a plan view showing the memory cells of the SRAM of the present invention, FIG. 2B is a conceptual view of the memory cells in FIG. 2A, and FIG. 3 is a sectional view taken along line III—III in FIG. 2A. In the plan view of FIG. 2A and in plan views shown in FIGS. 4 to 6 to be referred to later, insulator films other than field insulator films which are provided between respective conductor layers are not shown in order to facilitate understanding of the arrangement of the present embodiment.

Referring to FIGS. 2A and 3, numeral 1 designates a semiconductor substrate which is made of single-crystal silicon of the $n^-$-type. Numeral 2 designates a well region of the $p^-$-type, which is provided in the predetermined part of the main surface of the semiconductor substrate 1. Shown at numeral 3 is a field insulator film, which is provided over the main surfaces of the semiconductor substrate 1 and the well region 2. This field insulator film 3 isolates semiconductor elements from one another. In the part of the well region 2 under the field insulator film 3, a p-type channel stopper region 4 is provided. This channel stopper region 4 prevents parasitic MISFETs from operating, and electrically isolates the semiconductor elements.

In the SRAM of the present embodiment, the memory cells are constructed of n-channel MISFETs. The n-channel MISFETs are formed in the $p^-$-type well region 2. Though not shown, the peripheral circuits of the memory cells (sense amplifiers, decoders, a timing signal generator, input and output circuits, etc.) include complementary MIS circuits. n-channel and p-channel MISFETs constituting the complementary MIS circuits are respectively formed in the $p^-$-type well region 2 and the $n^-$-type semiconductor substrate 1. Each MISFET is substantially surrounded with the field insulator film 3, and has its configuration stipulated by the same. That is, each MISFET is formed in a region (active region) where the field insulator film 3 is not provided.

The switching MISFETs $Q_{s1}$ and $Q_{s2}$ comprise insulator films 5 as gate insulator films, conductor layers 7A as gate electrodes, $n^-$-type and $n^+$-type semiconductor regions 8 and 10 as source and drain regions, and $p^+$-type semiconductor regions 11 for preventing soft errors. The MISFET $Q_1$ comprises an insulator film 5 as a gate insulator film, a conductor layer 7D as a gate electrode, $n^-$-type and $n^+$-type semiconductor regions 8 and 10 as source and drain regions, and a $p^+$-type semiconductor region 11 for preventing soft errors. The MISFET $Q_2$ comprises an insulator film 5 as a gate insulator film, a conductor layer 7C as a gate electrode, $n^-$-type and $n^+$-type semiconductor regions 8 and 10 as source and drain regions, and a $p^+$-type semiconductor region 11 for preventing soft errors.

The MISFETs $Q_1$, $Q_2$, $Q_{s1}$ and $Q_{s2}$ are formed in the well region 2.

The gate insulator films 5 are made of silicon dioxide films which are formed on the parts of the main surface of the semiconductor substrate 1 as well as the well region 2 being the active regions.

The gate electrodes 7A, 7C and 7D are made of double-layer films (poly-cide structure) each of which comprises a film of polycrystalline silicon and a film of a silicide being the compound between silicon and a refractory metal (such as molybdenum, tantalum, titanium or tungsten), formed on the polycrystalline silicon film. The conductor layers 7A, 7C and 7D may well be made of silicide films, refractory metal films, etc. The gate electrode 7A is extended in the row direction over the field insulator film 3. That is, the conductor layer 7A is used as the word line WL.

The source and drain regions are brought into the so-called LDD (Lightly Doped Drain) structure by the semiconductor regions 8 and 10. In order to form the LDD structure, insulator films 9 are provided on both the sides of each of the conductor layers 7A to 7D in self-alignment thereto. The impurity introducing mask 9 may well be removed after the $n^+$-type semiconductor regions 10 and the $p^+$-type semiconductor regions 11 have been formed. The semiconductor region 8 has an impurity concentration lower than that of the semiconductor region 10. Thus, an electric field intensity at the p-n junction between the semiconductor region 8 and the well region 2 can be moderated. Since the junction depth ($x_j$) of the semiconductor region 8 is small, the coverage thereof under the gate electrode (into a region where a channel is formed) can be lessened. The semiconductor regions 8 are formed by ion implantation, using principally the gate electrodes 7A, 7C and 7D as a mask. The semiconductor region 10 is used for forming a source region or a drain region or the cross-coupling wiring of the flip-flop circuit. The semiconductor regions 10 are formed by introducing an impurity with ion implantation, using the impurity introducing mask 9. The insulator films 9 and the semiconductor regions 8 are omitted from all the plan views.

The layout of the MISFETs $Q_1$, $Q_2$, $Q_{s1}$ and $Q_{s2}$, which is schematically shown in FIG. 2B, is done as follows in order to cross-couple the two inverters.

Figure 4:
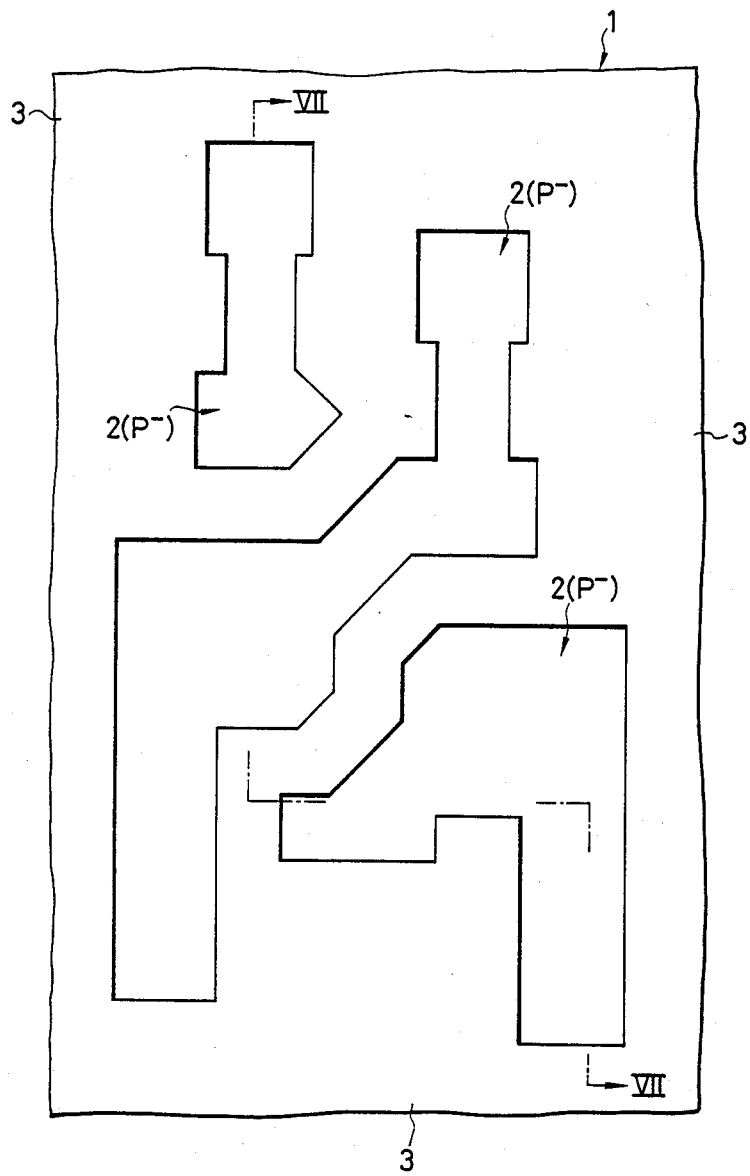

First, as regards the configuration of the field insulator film 3 within the memory cell, namely, the configuration of the MISFETs and the $n^+$-type semiconductor regions 10 as the wiring, FIG. 4 may be referred to.

The MISFETs $Q_2$ and $Q_{s2}$ are formed in one active region defined by the field insulator film 3. In this active region, parts for forming the MISFETs $Q_{s2}$ and $Q_2$ are respectively arranged in right upper and left lower areas in FIGS. 2A and 2B. These two parts are made unitary by the $n^+$-type semiconductor region 10 which is formed obliquely from a right upper position to a left lower position in FIGS. 2A and 2B. This semiconductor region 10 is the wiring for connecting the MISFETs $Q_{s2}$ and $Q_2$, and is the source or drain region common to them. On the other hand, active regions for forming the MISFETs $Q_1$ and $Q_{s1}$ are independently formed in right lower and left upper areas in FIGS. 2A and 2B respectively. The connection between the MISFETs $Q_1$ and $Q_{s1}$ is done by the gate electrode to be described below.

Figure 5:
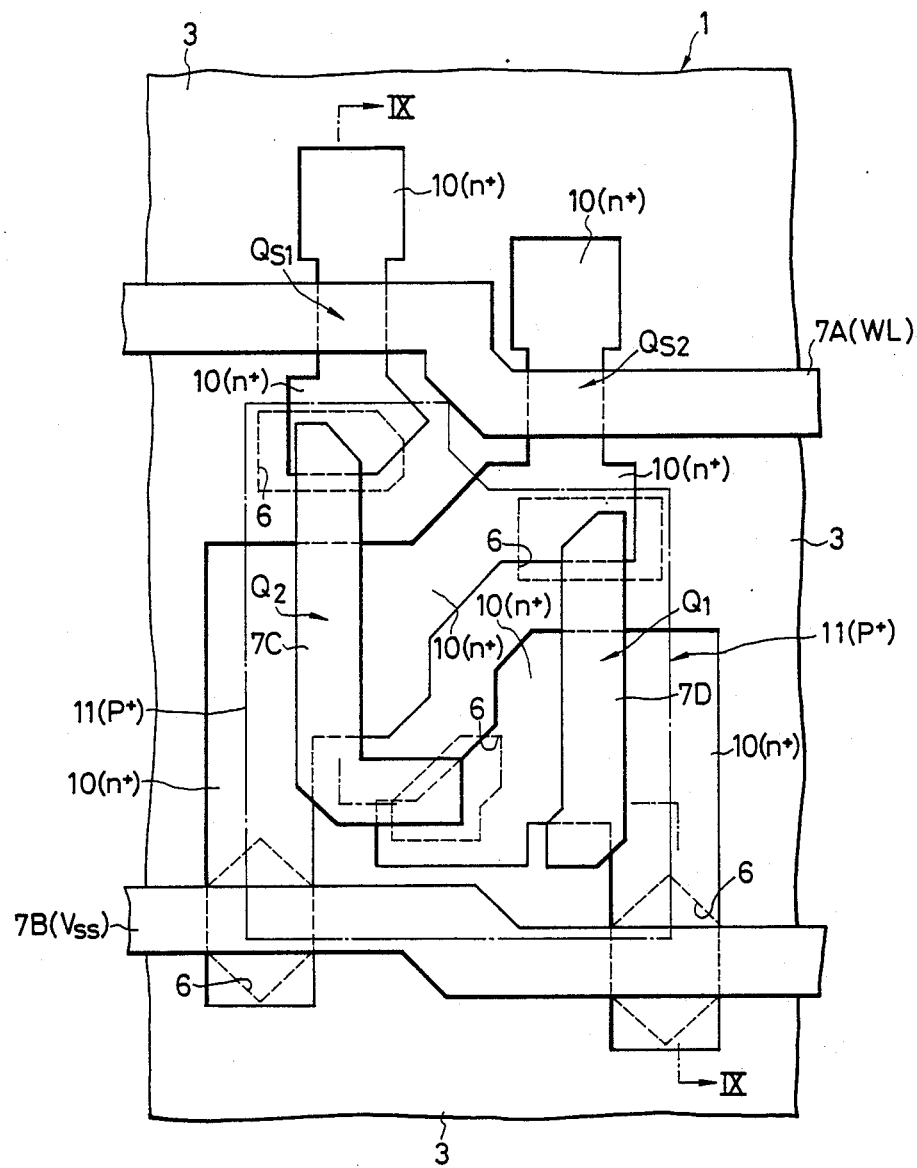

Secondly, as regards the configurations of the gate electrodes 7D and 7C of the respective MISFETs $Q_1$ and $Q_2$, FIG. 5 may be referred to.

The conductor layer 7C which is the gate electrode of the MISFET $Q_2$ has one end part connected with the semiconductor region (source or drain region) 10 of the MISFET $Q_{s1}$ through a contact hole 6 formed in the insulator film 5, and has the other end part connected with the semiconductor region (source or drain region) 10 of the other MISFET $Q_1$ through a contact hole 6. The conductor layer 7C forming the gate electrode of the MISFET $Q_2$, also serves as wiring for connecting the gate electrode of the MISFET $Q_2$ and the source or drain regions of the MISFETs $Q_{s1}$ and $Q_1$, and as wiring for connecting the MISFETs $Q_1$ and $Q_{s1}$. The conductor layer 7D which is the gate electrode of the MISFET $Q_1$ has one end part connected with the semiconductor region (source or drain region) 10 of the MISFET $Q_{s2}$ through a contact hole 6. The conductor layer 7D forming the gate electrode of the MISFET $Q_1$, also serves as wiring for connecting the gate electrode of the MISFET $Q_1$ and the source or drain region of the MISFET $Q_{s2}$. These two points will be understood by referring to FIG. 2B.

Owing to the configuration of the field insulator film 3 and the gate electrode 7C (and the gate electrode 7D), the cross coupling of the two inverter circuits is realized without hampering enhancement in the density of integration. More specifically, the semiconductor regions 10 (and 8) defined by the field insulator film 3, and the gate electrodes 7C and 7D are used as the wiring for the cross coupling. Any wiring exclusive for the cross coupling and any area for connecting it are not necessary. Any conductor layer for forming resistance elements is not used, either. Accordingly, the spacing between the gate electrodes 7C and 7D and the spacing between the resistance elements diminish.

The source and drain regions of the MISFETs $Q_{s2}$ and $Q_2$ may well be connected by shaping the gate electrode 7D similarly to the gate electrode 7C. Since the conductor layer 7C (7D) has as low a resistance as several $\Omega/\square$, it can be used as the wiring for connecting the MISFETs.

The sources of the two drive MISFETs $Q_1$ and $Q_2$ are supplied with the ground potential $V_{ss}$ (=0 V) of the circuitry by the conductor layer 7B. Since the conductor layer 7B is formed of the same material and by the same step as those of the conductor layers 7A, 7C and 7D, the resistance value thereof is as small as several $\Omega/\square$.

The conductor layer 7B is connected with the source regions of the MISFETs $Q_1$ and $Q_2$ through contact holes 6. This conductor layer 7B is provided while extending in the row direction over the field insulator film 3 substantially in parallel with the conductor layer 7A. It forms a ground potential line common to a plurality of memory cells arranged in the row direction. The source regions of the MISFETs $Q_1$ and $Q_2$ are made larger than the drain regions thereof by parts for the connection with the conductor layer 7B. In particular, the source regions are made longer than the drain regions in the lengthwise direction of the gate electrodes 7C and 7D as shown in FIG. 2B. Thus, the conductor layer 7B can be prevented from overlapping the conductor layers 7C and 7D and can be made substantially rectilinear without lowering the density of integration.

Since the conductor layer 7B has a low resistance value, it can suppress the occurrence of the fluctuation of the potential thereof ascribable to currents flowing through the memory cells. Since, in this way, margins in the operation of writing and reading information can be widened, malfunctions can be prevented. Moreover, in a case where the wiring for supplying the ground potential is made of a semiconductor region, the cross-sectional area thereof needs to be enlarged for lowered resistance. This leads to the disadvantage that the width of the wiring enlarges. Since the resistance value of the conductor layer 7B is roughly one order smaller than that of the semiconductor region (the former is several hundredths of the latter), the area of the ground potential line becomes smaller. It is accordingly possible to reduce the areas of the memory cells and the memory cell array in the column direction. Further, as exemplified in FIG. 2B, aluminum wiring $L_{vss}$ needs to be run for a predetermined number of memory cells and to be connected with the conductor layer 7B so as to suppress the fluctuation of the potential thereof. In this regard, since the conductor layer 7B has a low resistance value, the number of the aluminum wiring lines $L_{vss}$ can be reduced. Thus, the density of integration in the row direction in the memory cell array can be significantly enhanced.

In order to prevent the soft errors and to increase the parasitic capacitances of the storage nodes of the memory cell, the $p^+$-type semiconductor region 11 is formed.

The semiconductor region 11 is provided in contact with the semiconductor regions 10. This semiconductor region 11 is provided especially under the two semiconductor regions 10 of each of the MISFETs $Q_1$ and $Q_2$ and under one semiconductor region 10 of each of the MISFETs $Q_{s1}$ and $Q_{s2}$ (in a part enclosed with a dot-and-dash line 11 in FIGS. 2A and 5). More specifically, it is added to the semiconductor regions 10 shown in FIG. 2B. In other words, the semiconductor region 11 is provided in those parts of the memory cell which contribute to increase the parasitic capacitances C of the storage nodes for information. Since the p-n junction between the semiconductor region 11 and the semiconductor region 10 is one of the regions of high impurity concentrations, the junction capacitance thereof can be increased. Thus, soft errors attributed to alpha particles can be prevented. The semiconductor region 11 is formed at an impurity concentration higher than that of the well region 2. Accordingly, it can serve as a barrier for suppressing the intrusion of minority carriers created in the well region 2 by alpha particles and can prevent soft errors.

The semiconductor region 11 is formed by introducing an impurity with ion implantation, using the gate electrodes 7C and 7D and the impurity introducing mask 9. Accordingly, the semiconductor region 11 is constructed so as not to reach the region where the channel is formed. It does not affect the threshold voltages of the MISFETs $Q_1$ and $Q_2$. Since the allowance of mask registration for construction the semiconductor region 11 is not required, the density of integration can be raised.

The impurity for constructing the semiconductor region 11 (for example, boron ions) is higher in the diffusion coefficient when compared with the impurity for constructing the semiconductor regions 10 (for example, arsenic ions). Since both the impurities are ion-implanted using the identical mask, the semiconductor region 11 is provided along the semiconductor regions 10 or so as to envelop the semiconductor regions 10. Thus, the areas of the p-n junctions between the semiconductor region 11 and the semiconductor regions 10 can be increased. The semiconductor region 11 is also formed under the semiconductor regions 8 by the difference of the diffusion coefficient. This can prevent the combination of depletion regions (e.g., punch-through) between the semiconductor regions 10 functioning as the source region and the drain region. Thus, the short channel effect can be reduced.

The semiconductor region 11 may well be used merely for enhancing the function of the barrier to the minority carriers. In that case, it can be formed in a deeper part apart from the semiconductor regions 10.

The semiconductor regions 10 may well be constructed using the conductor layers 7A-7C as a mask, the semiconductor region 11 may well be constructed using the conductor layers 7A-7C and the impurity introducing mask 9, and the semiconductor regions 8 need not be provided.

An insulator film 12 is formed so as to cover the MISFETs $Q_1$, $Q_2$, $Q_{s1}$ and $Q_{s2}$. The insulator film 12 is made of, for example, a silicon oxide film.

The resistance elements $R_1$ and $R_2$ and the wiring for applying the power source potential $V_{cc}$ thereto are formed on the insulator film 12. They are formed using a polycrystalline silicon layer 14 which is formed on the insulator film 12. The polycrystalline silicon layer 14 comprises parts (conductor layers) 14A whose resistance is lowered by introducing an impurity, and parts of high resistance 14B in which no impurity is introduced. The impurity, for example, arsenic is introduced into a part other than a part (14B) which is enclosed with a dot-and-dash line 14B indicated in FIGS. 2A and 6.

The conductor layer 14A is placed over the conductor layer 7B (the wiring for the ground potential), and is extended in the row direction on the insulator film 12. This forms the wiring for the power source potential, which is connected to the respective memory cells arranged in the row direction.

Owing to the fact that the conductor layer 14A (the wiring for the power source potential) and the conductor layer 7B (the wiring for the ground potential) are placed with the insulator film 12 intervening therebetween, a capacitor is inserted between the power source potential and the ground potential as illustrated in FIG.

2B. This capacitor has a higher capacitance because of the thinner insulator film, when compared with a capacitor in which the conductor layer 14A is placed over a wiring for a ground potential made of a semiconductor region.

This capacitor can lessen the malfunction of the memory cells attributed to the fluctuation of the power source potential or the ground potential. Parts of the conductor layers 7B and 14A may well be formed wider than the other parts so as to increase the capacitance.

The part 14B in which no impurity is introduced (the part which is enclosed with the dot-and-dash line 14B) is used as the resistance element $R_1$ and $R_2$. One end of each of the resistance elements $R_1$ and $R_2$ is connected to the power source potential wiring 14A. The other end of the resistance element $R_1$ is connected to the source or drain region 10 of the MISFET $Q_{s1}$ through a contact hole 6 and a contact hole 13 which is formed in the insulator film 12. In addition, the other end of the resistance element $R_1$ is connected to the gate electrode 7C of the MISFET $Q_2$ through the contact hole 13. In consequence, it is connected to the source or drain region 10 of the MISFET $Q_1$ through the gate electrode 7C. The other end of the resistance element $R_2$ is connected to the gate electrode 7D of the MISFET $Q_1$ through a contact hole 13. In addition, the other end of the resistor $R_2$ is connected to the common source or drain region 10 of the MISFETs $Q_{s2}$ and $Q_2$ through contact holes 6 and 13.

Since the gate electrodes 7C and 7D are shaped as stated before, the resistance elements $R_1$ and $R_2$ can complete all the necessary connections substantially by the mere connections thereof to the gate electrodes 7C and 7D. This point will become more apparent from FIG. 2B. Besides, owing to the foregoing shapes of the gate electrodes 7C and 7D, the wiring lines for the cross coupling of the flip-flop circuit, etc. need not be constructed by the use of the polycrystalline silicon 14. Accordingly, the resistance elements 14B can be constructed sufficiently long between the conductor layer 14A and the contact holes 13.

Since the resistance elements 14B are constructed sufficiently long, the resistance values thereof can be increased. Accordingly, standby currents to flow from the resistance elements 14B can be diminished in order to hold information. Moreover, the sufficiently long construction of the resistance elements 14B can prevent the combination (punch-through) of the depletion regions which are formed within the resistance elements 14B from the junctions between the resistance elements 14B and the conductor layer 14A and the junctions between the resistance elements 14B and the semiconductor regions 10 and the conductor layers 7C, 7D.

The resistance element 14B is placed over the conductor layer 7C or the conductor layer 7D through the insulator film 12, and is disposed extending in the column direction substantially similarly. That is, an MIS type structure (refer to FIG. 2B) is constructed in which the conductor layer 7C or 7D is a gate electrode, the insulator film 12 is a gate insulator and the resistance element 14B is a semiconductor. The n+-type semiconductor region 10 and the conductor layer 14A can be regarded as source and drain regions. The conductor layer 14A is of the n+-type because it is formed by introducing arsenic. Accordingly, the resistance element 14B can be regarded as the channel region of a parasitic n-channel MISFET. Now, let's consider a case where a high level potential is applied to the conductor layer 7D (gate electrode) of the MISFET $Q_1$ and where a low level potential is applied to the conductor layer 7C (gate electrode) of the MISFET $Q_2$. The current from the power source potential $V_{cc}$ becomes easy to flow through the resistance element 14B ($R_2$), whereas it becomes difficult to flow through the resistance element 14B ($R_1$). That is, the resistance elements 14B ($R_1$, $R_2$) change their resistance values (are self-biased) in accordance with information (a voltage) written in the memory cell. As a result, the currents can be supplied in the direction in which the voltage difference between "1" and "0" is clarified. This is effective to stably hold the information and to enhance the speed of writing the information into the memory cell.

An insulator film 15 is provided on the conductor layer 14A and the resistance elements 14B. The insulator film 15 electrically isolates the conductor layer 14A and the resistance elements 14B from a conductor layer 17 to be provided on them.

The conductor layer 17 is provided so as to be electrically connected with the predetermined semiconductor regions 10 through contact holes 16, to extend in the column direction across the conductor layers 7A, 7B and 14B over the insulator film 15 and to be placed over the conductor layers 7C, 7D and the resistance elements 14B. This conductor layer 17 serves to construct data lines DL and $\overline{DL}$. By stacking the conductor layers 7C and 17 and the resistance element 14B or the conductor layers 7D and 17 and the resistance element 14B, the area of the SRAM can be reduced, and hence, the density of integration thereof can be enhanced.

On the left (or right)-hand side of the memory cell in FIG. 2A, a memory cell which is in line symmetry with respect to a line Xa—Xa (or Xb—Xb) is arranged. The two memory cells form one unit, and a large number of such units are arrayed in the row direction. Additionally, on the upper (or lower) side of the illustrated memory cell in FIG. 2A, a memory cell which is in point symmetry with respect to a point Ya (or Yb) is arranged. The two memory cells form one unit, and a large number of such units are arrayed in the column direction.

Next, a method of manufacturing the present embodiment will be described.

Figure 6:
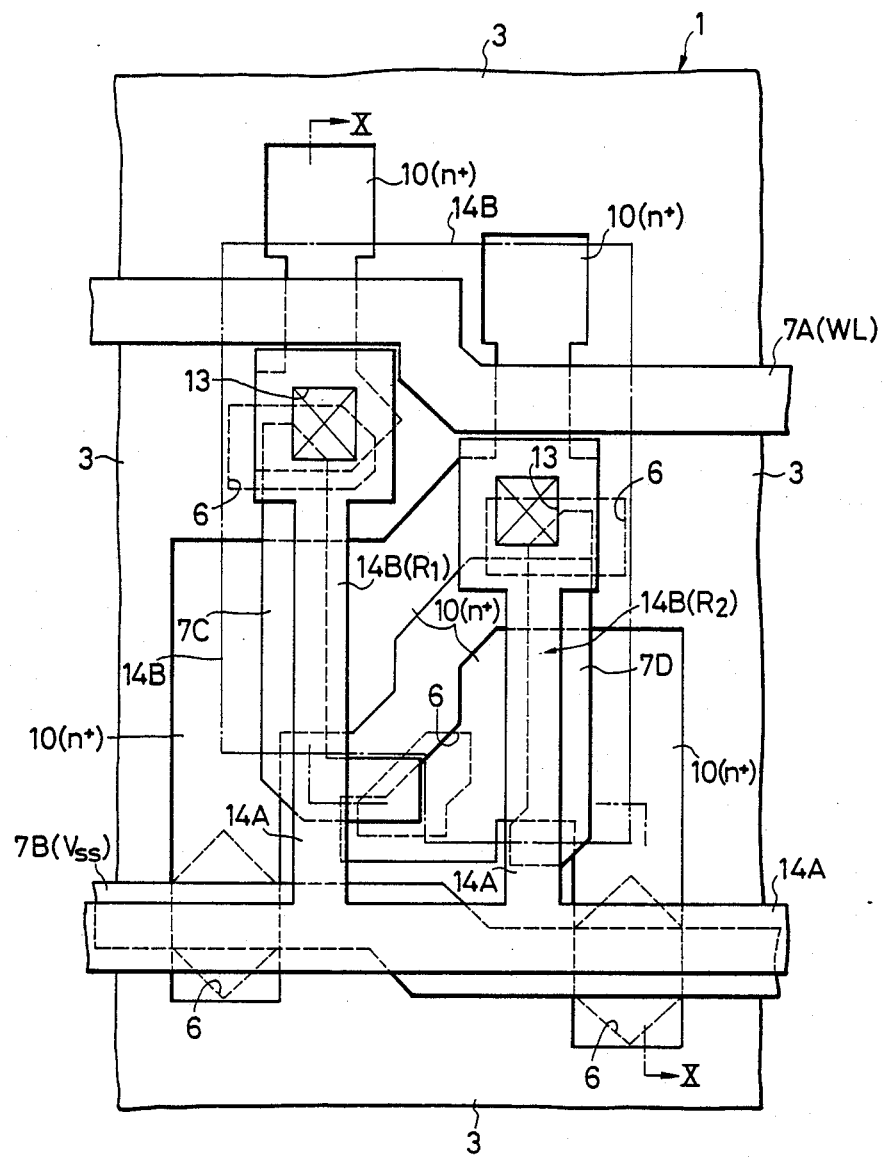
Figure 7:
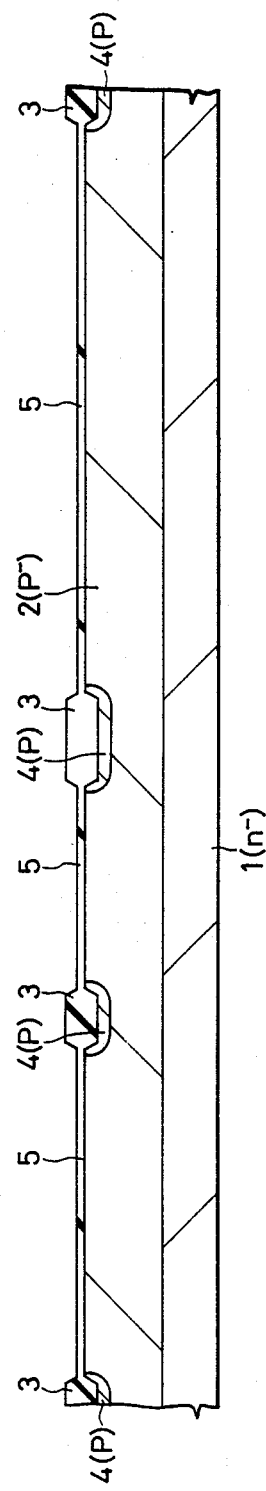
Figure 8:
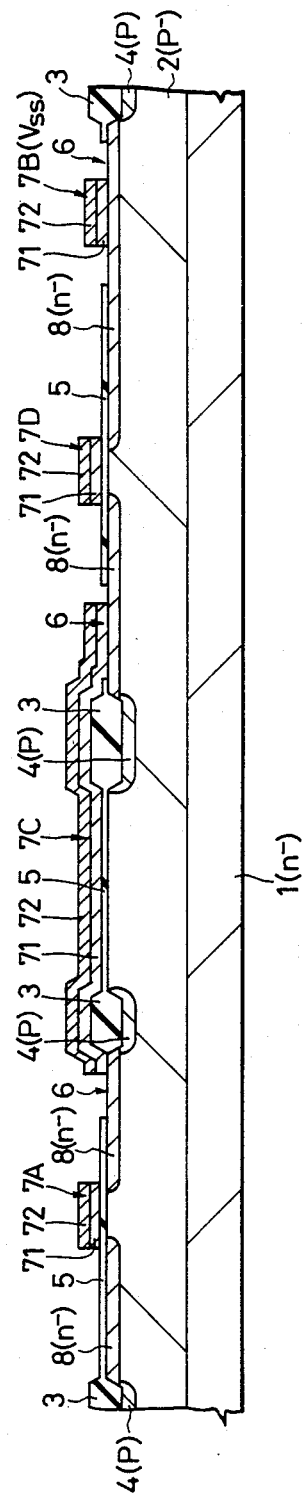
Figure 9:
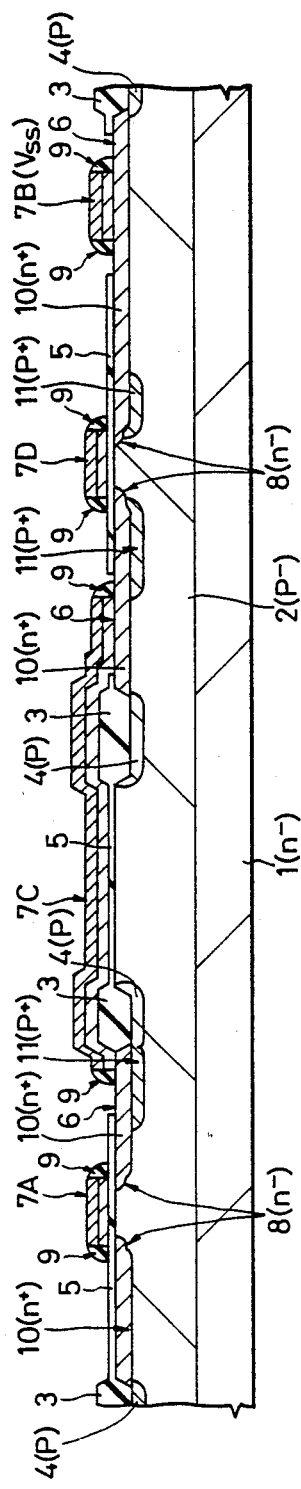
Figure 10:
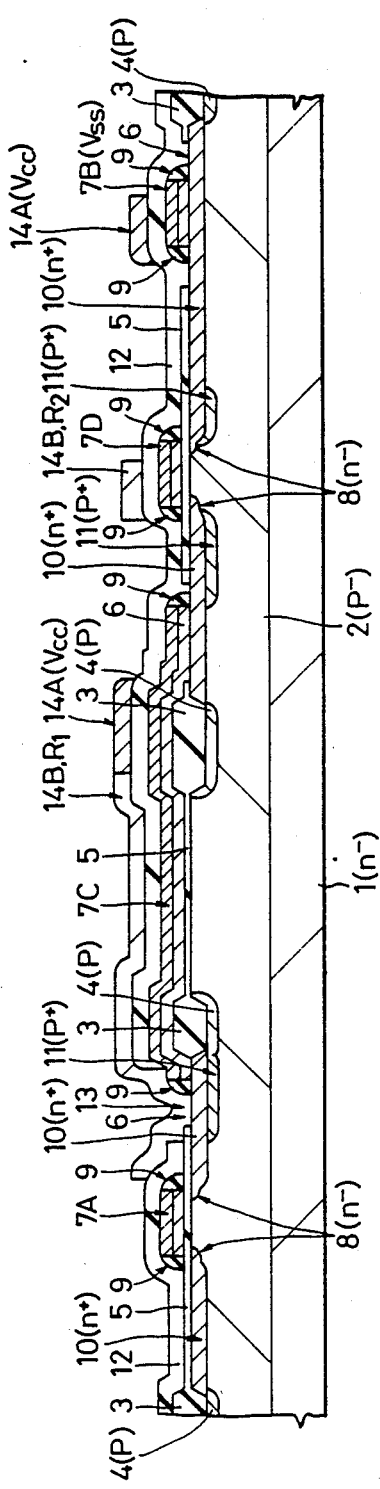

FIGS. 4 to 10 are views for explaining the method of manufacturing the SRAM shown in FIGS. 2A, 2B and 3. FIGS. 4 to 6 are plan views of the memory cell of the SRAM at several manufacturing steps, while FIGS. 7 to 10 are sectional views thereof. FIG. 7 shows a section taken along line VII—VII in FIG. 4, FIG. 9 shows a section taken along line IX—IX in FIG. 5, and FIG. 10 shows a section taken along line X—X in FIG. 6.

First, a semiconductor substrate 1 of the n−-type made of single-crystal silicon is prepared. A well region 2 of the p−-type is formed in the predetermined main surface portion of the semiconductor substrate 1. By way of example, the well region 2 is formed in such a way that $BF_2$ ions at approximately $2 \times 10^{12}$ [atoms/cm$^2$] are introduced by ion implantation using an energy of approximately 60 [keV] and are subjected to drive-in diffusion.

A field insulator film 3 is formed on the predetermined parts of the semiconductor substrate 1 and the well region 2. Besides, channel stopper regions 4 of the p-type are formed in the predetermined parts of the well region 2. Used as the field insulator film 3 is a silicon oxide film which is formed by local thermal oxidation. By way of example, the channel stopper regions 4 are formed in such a way that BF$_2$ ions at approximately 3×10$^{13}$ [atoms/cm$^2$] are introduced by ion implantation using an energy of approximately 60 [keV] and are annealed by the step of forming the field insulator film 3.

Subsequently, as shown in FIGS. 4 and 7, an insulator film 5 is formed on the parts of the main surfaces of the semiconductor substrate 1 and the well region 2 to become regions for forming semiconductor elements. The insulator film 5 is, for example, a silicon oxide film which is formed by thermal oxidation and which has a thickness of 200-300 [Å]. After the insulator film 5 has been formed, the predetermined parts thereof are removed so as to form contact holes 6.

As shown in FIG. 8, conductor layers 7A-7D are formed on the field insulator film 3 and the insulator film 5. Each of the conductor layers 7A-7D is made up of a double-layer film which is connected with the predetermined part of the main surface of the well region 2 through the contact hole 6. That is, it is formed of a polycrystalline silicon film 71 which is formed by, e.g., CVD (Chemical Vapor Deposition) and in which phosphorus is introduced in order to lower the resistance value thereof, and a molybdenum silicide film 72 which is formed on the film 71 by sputtering. The thickness of the polycrystalline silicon film 71 is, e.g., approximately 2000 [Å], and that of the molybdenum silicide film 72 is, e.g., approximately 3000 [Å]. Since the conductor layers 7A to 7D contain molybdenum silicide, their resistance value can be rendered several [Ω/□].

Though not shown, an n-type semiconductor region is formed by the diffusion of the phosphorus introduced in the polycrystalline silicon film 71, in that main surface part of the well region 2 which is connected with the conductor layer 7B, 7C or 7D through the contact hole 6.

Subsequently, as shown in FIG. 8, semiconductor regions 8 of the n$^-$-type are formed in order to construct the LDD structures in the main surface of the well region 2 at the parts of both the sides of each of the conductor layers 7A, 7C and 7D with the insulator film 5 intervening therebetween. Using the conductor layers 7A, 7C and 7D and the field insulator film 3 as a mask for introducing an impurity, phosphorus is ion-implanted at a dose of approximately 1×10$^{13}$ [atoms/cm$^2$] and an energy of approximately 50 [keV] by way of example. It is thereafter annealed. Thus, the semiconductor regions 8 are formed.

After the semiconductor regions 8 have been formed, an impurity introducing mask 9 is formed on both the sides of each of the conductor layers 7A to 7D. By way of example, the impurity introducing mask 9 is formed in such a way that a silicon oxide film is provided on the whole surface of the resultant substrate by CVD, whereupon it is subjected to reactive ion etching. The mask 9 is an insulator film which is formed in self-alignment to the conductor layers 7A-7D.

Using the impurity introducing mask 9 and the conductor layers 7A to 7D as a mask for ion implantation, semiconductor regions 10 of the n$^+$-type are formed in the predetermined parts of the main surface of the well region 2. The semiconductor regions 10 construct the source regions or drain regions of MISFETs. By way of example, arsenic is ion-implanted at a dose of approximately 1×10$^{16}$ [atoms/cm$^2$] and an energy of approximately 80 [keV] and is thereafter annealed.

Thereafter, an impurity introducing mask is formed in order to form p$^+$-type semiconductor regions which serve principally to prevent soft errors. This mask covers a part except an area which is enclosed with a dot-and-dash line 11 in FIG. 5.

In the state in which this impurity introducing mask has been formed, ion implantation is carried out using the mask 9 and the conductor layers 7C, 7D as a mask. Then, as shown in FIGS. 5 and 9, the p$^+$-type semiconductor regions 11 are formed under the predetermined ones of the semiconductor regions 10. By way of example, boron is ion-implanted at a dose of approximately 1×10$^{13}$ [atoms/cm$^2$] and an energy of approximately 50 [keV] and is thereafter annealed. Referring to FIG. 5, the impurity to form the semiconductor regions 11 is introduced through the insulator film 5 into the region enclosed with the dot-and-dash line 11.

The conductor layers 7A to 7D and the semiconductor regions 8 and 10 are formed by the same manufacturing steps as the steps of forming MISFETs which constitute peripheral circuits. In addition, the semiconductor regions 11 may well be formed under predetermined n$^+$-type semiconductor regions, for example, under the source regions and drain regions of MISFETs which constitute an input protection circuit.

After the step of forming the semiconductor regions 11, an insulator film 12 is formed. The insulator film 12 is, for example, a silicon oxide film which is formed by CVD and which has a thickness of approximately 1000-2000 [Å]. The predetermined parts of the insulator film 12 overlying the conductor layers 7C, 7D and the semiconductor regions 10 are removed to form contact holes 13.

Thereafter, a polycrystalline silicon film 14 which is connected with the predetermined ones of the semiconductor regions 10 through the contact holes 13 is formed in order to form wiring 14A for a power source potential and resistance elements 14B. By way of example, the polycrystalline silicon film may be formed by CVD to a thickness of approximately 1000-2000 [Å]. An impurity for lowering a resistance value is introduced into that part of the polycrystalline silicon film which is other than regions for forming the resistance elements 14B and which becomes the power source potential wiring 14A. Arsenic used as the impurity is introduced by ion implantation, and is thereafter annealed. Since the impurity is introduced by the ion implantation, the controllability of the resistance value is good. Moreover, owing to the ion implantation, the extention of the impurity under the impurity introducing mask is slight. Accordingly, the allowances of processing dimensions can be rendered small, and the resistance elements 14B can be constructed sufficiently long.

Thereafter, as shown in FIGS. 6 and 10, the polycrystalline silicon film is patterned to form the conductor layer 14A which is used as the power source potential wiring and the resistance elements 14B which are used as resistance elements R$_1$ and R$_2$. The impurity for forming the conductor layer 14A is introduced into the part of the polycrystalline silicon film other than an area enclosed with a dot-and-dash line 14B in FIG. 6.

After the step of forming the conductor layer 14A and the resistance elements 14B, an insulator film 15 is formed. This insulator film 15 is, for example, a silicon oxide film which is formed by CVD and whose thickness is approximately 3000-4000 [Å]. The predetermined parts of the insulator films 5, 12 and 15 overlying the semiconductor regions 10 are removed to form contact holes 16.

Thereafter, as shown in FIGS. 2A and 3, a conductor layer 17 which is electrically connected with the predetermined ones of the semiconductor regions 10 through the contact holes 16 is formed. The conductor layer 17 extends on the insulator film 15 in the column direction so as to cross the conductor layer 7A. It is, for example, an aluminum film formed by sputtering.

Thereafter, the processing steps of a passivation film etc. are carried out. The SRAM of the present embodiment is finished up by these series of manufacturing steps.

According to the novel technical means disclosed in the present invention, effects listed below can be attained:

(1) The gate electrode of one MISFET of a flip-flop circuit composed of two MISFETs is extended to form wiring for cross coupling. Owing to this construction, it is dispensed with to provide any special wiring for cross coupling between gate electrodes, so that the pitch between the gate electrodes can be reduced. Besides, owing to the above construction, it is dispensed with to provide any special wiring for cross coupling between resistance elements which lie above the gate electrodes, so that the pitch between the resistance elements can be reduced. Since the occupation area of the memory cell can be reduced by the aforementioned two features, the density of integration of an SRAM can be enhanced.

(2) The gate electrode of one MISFET of a flip-flop circuit composed of two MISFETs is extended to form wiring for cross coupling. Thus, the conductor layer formed by the same step as that of the resistance elements makes it unnecessary to provide any special wiring for cross coupling, so that only a margin for the mask registration between the resistance elements and wiring for a power source potential may be considered and that the resistance elements can be reduced in size or can be constructed sufficiently long. Since the resistance elements can be reduced in size, the occupation area of the memory cell can be reduced, and the density of integration of an SRAM can be enhanced.

(3) The gate electrodes of MISFETs and resistance elements, which constitute a memory cell, and data lines which are connected to the memory cell, are placed one over another, whereby a planar area can be reduced, so that the density of integration of an SRAM can be enhanced.

(4) The gate electrodes of MISFETs which constitute the flip-flop circuit of a memory cell, and resistance elements are placed one over the other. In this way, the resistance elements can be self-biased, so that charges to serve as information can be stably held. Also in this way, the margin of read-out in a reading operation can be widened.

(5) An impurity for decreasing the resistance value of a conductor layer made of polycrystalline silicon is introduced by ion implantation. Since the ion implantation is lower in the impurity concentration-dependence than thermal diffusion, the controllability of the resistance value can be improved. In addition, the resistance values of resistance elements can be controlled at high precision. Owing to the use of the ion implantation, the coverage of the impurity under an impurity introducing mask for forming the resistance elements can be lessened, so that allowances for the processing dimensions of the resistance elements can be decreased. Accordingly, the occupation areas of the resistance elements can be reduced, and the density of integration of an SRAM can be enhanced. Besides, since the allowances for the processing dimensions of the resistance elements can be decreased, these resistance elements can be constructed sufficiently long. Since the resistance elements can be constructed sufficiently long, standby currents to flow through these resistance elements can be diminished. In addition, since the resistance elements can be formed long, the combination (punch-through) between depletion regions to spread in the resistance elements can be prevented.

(6) On the sides of the gate electrode of a predetermined MISFET which constitutes a memory cell, an impurity introducing mask is provided in self-alignment. The impurity introducing mask is used for providing a first semiconductor region which serves as a source region or a drain region, and a second semiconductor region which is opposite in the conductivity type to the first semiconductor region and which underlies the first semiconductor region. Thus, an allowance for the mask registration between the gate electrode and the second semiconductor region is dispensed with, so that the density of integration of an SRAM can be enhanced. Besides, the coverage of the second semiconductor region into a channel region can be prevented, so that the fluctuation of the threshold voltage of the MISFET and the increase of the substrate effect can be prevented.

(7) As stated in Item (6), the second semiconductor region is provided along and under the first semiconductor region. For this reason, the capacitance of the p-n junction between the first semiconductor region and the second semiconductor region can be increased, so that the parasitic capacitance of a node for storing information can be increased. For the same reason, the second semiconductor region can be used as a barrier which prevents minority carriers, created in a well region (or a substrate), from entering the storage node of the information. Owing to the above two features, soft errors ascribable to alpha particles can be prevented.

(8) By providing each second semiconductor region in a part where a depletion region spreading to a region in which a channel is formed is suppressed, the combination (punch-through) of the depletion regions between a source region and a drain region can be prevented. Accordingly, the short channel effect can be reduced.

(9) Wiring for the ground potential, which is connected to memory cells, is formed of a conductor layer of low resistance made of poly-cide, silicide, a refractory metal or the like, so that the occupation area of the ground potential wiring in a memory cell array can be reduced. Since the number of aluminum wiring lines to be connected with the ground potential wiring can be decreased, the occupation area of the aluminum wiring in the memory cell array can be reduced. In addition, the resistance value of the ground potential wiring can be decreased, and the stability of the potential thereof can be improved, so that the margins of the operations of writing and reading information can be widened. Accordingly, malfunctions in the information writing and reading operations can be suppressed, and the electrical reliability of an SRAM can be enhanced.

(10) Since wiring for the ground potential and wiring for a power source potential are placed one over the other, the information of a memory cell is less influenced by fluctuations in the power source potential and/or the ground potential. In addition, the occupation area of the memory cell can be reduced, so that the density of integration of an SRAM can be enhanced.

While the invention made by the inventors has thus far been concretely described in conjunction with one embodiment, it is a matter of course that the present invention is not restricted to the foregoing embodiment but that it can be variously modified within a scope not departing from the purport thereof.

For example, the flip-flop circuit of a memory cell may well be constructed of two P-channel MISFETs as load elements and two N-channel MISFETs. Also, if desired, the load elements may well be omitted.

A MISFET to constitute a memory cell need not be the LDD structure.

MISFETs to constitute a flip-flop circuit and switching elements may well be formed in a semiconductor substrate.

The conductivity types of various semiconductor regions may well be reversed.

We claim:

1. A semiconductor integrated circuit device comprising:
   word lines which are made of a double-layer film comprising a first film of polycrystalline silicon and a second film of a silicide formed as a compound of silicon and a refractory metal and which extend in a row direction over a semiconductor substrate;
   data lines which extend in a column direction over said semiconductor substrate and two of which constitute one set of complementary data lines, each set of complementary data lines being connected to an identical memory cell;
   a plurality of memory cells each of which comprises cross-coupled first and second MISFETs, first and second switching MISFETs being connected between said first and second MISFETs and said complementary data lines and having their gate electrodes connected to said word lines, said first and second MISFETs and said first and second switching MISFETs each comprising source and drain regions in said semiconductor substrate, and a gate electrode on a first insulation film on said semiconductor substrate; and
   first wiring lines which are formed on a second insulation film on said semiconductor substrate, which serve to supply a ground potential to said memory cells, and which are made of the same layers as those of said word lines, wherein a thickness of said second insulation film is thicker than a thickness of said first insulation film.

2. A semiconductor integrated circuit device according to claim 1, wherein one of said source or drain of each of said first and second MISFETs is connected to said first wiring lines through via contact holes.

3. A semiconductor integrated circuit device according to claim 2, wherein said first and second MISFETs are n-channel MISFETs.

4. A semiconductor integrated circuit device according to claim 2, further comprising:
   load elements which are respectively coupled to said first and second MISFETs; and
   a second wiring which serves to supply a power source potential to said load elements and which is formed over said first wiring with a third insulation film intervening therebetween.

5. A semiconductor integrated circuit device according to claim 4, wherein said word line is made of a layer which contains a refractory metal, and wherein said load elements and said second wiring are made of polycrystalline silicon and are unitarily formed, said first, second and third insulation films being made of silicon oxide films.

6. A semiconductor integrated circuit device according to claim 1, wherein said first wiring lines extend substantially in the same direction as that of said word lines.

7. A semiconductor integrated circuit device according to claim 2, wherein said refractory metal is molybdenum.

8. A semiconductor integrated circuit device according to claim 2, wherein said refractory metal is tantalum.

9. A semiconductor integrated circuit device according to claim 2, wherein said refractory metal is titanium.

10. A semiconductor integrated circuit device according to claim 2, wherein said refractory metal is tungsten.

11. A semiconductor integrated circuit device according to claim 2, wherein each of said word lines is made of silicide film.

12. A semiconductor integrated circuit device comprising:
    word lines which are made of a double-layer film comprising a first film of polycrystalline silicon and a second film of a silicide formed as a compound of silicon and a refractory metal and which extend in a row direction over a semiconductor substrate;
    data lines which extend in a column direction over said semiconductor substrate and two of which constitute one set of complementary data lines, each set of complementary data lines being connected to an identical memory cell;
    a plurality of memory cells each of which comprises cross-coupled first and second MISFETs, first and second switching MISFETs being connected between said first and second MISFETs and said complementary data lines and having their gate electrodes connected to said word lines, said first and second MISFETs and said first and second switching MISFETs each comprising source and drain regions in said semiconductor substrate, and a gate electrode on a first insulation film on said semiconductor substrate;
    first wiring lines which are formed on a second insulation film on said semiconductor substrate, which serve to supply a ground potential to said memory cells, which are made of the same layers as those of said word lines, wherein a thickness of said second insulation film is thicker than a thickness of said first insulation film;
    load elements which are respectively coupled to said first and second MISFETs; and
    a second wiring line which serves to supply a first fixed potential to said load elements and which is formed over said first wiring with a third insulation film intervening therebetween.

13. A semiconductor integrated circuit device according to claim 12, wherein said first and second MISFETs are n-channel MISFETs.

14. A semiconductor integrated circuit device according to claim 12, wherein said load elements are made of the same layers as those of said second wiring lines and are formed with said second wiring lines integrally.

15. A semiconductor integrated circuit device according to claim 12, wherein said load elements and said second wiring are made of polycrystalline silicon and are unitarily formed and wherein said first, second and third insulation films are made of silicon oxide films.

16. A semiconductor integrated circuit device according to claim 2, wherein said gate electrodes of said first and second MISFETs are made of the same layer as that of said word line, and one of said source and drain regions of each of said first and second MISFETs connected with said first wiring is formed longer than the other in a direction in which said gate electrode of said each MISFET extends.

17. A semiconductor integrated circuit device according to claim 12, wherein said first wiring lines extend substantially in the same direction as that of said word lines.

* * * * *